US007866562B2

(12) United States Patent
Hiew et al.

(10) Patent No.: US 7,866,562 B2
(45) Date of Patent: Jan. 11, 2011

(54) FIXED WRITE-PROTECT SEAMLESS MEMORY CARD

(75) Inventors: Siew Sin Hiew, San Jose, CA (US); Nan Nan, San Jose, CA (US); Abraham Chih-Kang Ma, Fremont, CA (US); Jim Chin-Nan Ni, San Jose, CA (US)

(73) Assignee: SuperTalent Electronics, Inc., San Jose, CA (US)

( * ) Notice: Subject to any disclaimer, the term of this patent is extended or adjusted under 35 U.S.C. 154(b) by 768 days.

(21) Appl. No.: 11/770,661

(22) Filed: Jun. 28, 2007

(65) Prior Publication Data

US 2008/0037308 A1 Feb. 14, 2008

Related U.S. Application Data

(63) Continuation-in-part of application No. 11/744,119, filed on May 3, 2007, and a continuation-in-part of application No. 10/913,868, filed on Aug. 6, 2004, now Pat. No. 7,264,992, and a continuation-in-part of application No. 10/888,282, filed on Jul. 8, 2004.

(51) Int. Cl.
*G06K 19/06* (2006.01)

(52) U.S. Cl. ........................ 235/492; 235/487; 235/488

(58) Field of Classification Search ................. 235/487, 235/488, 492

See application file for complete search history.

(56) References Cited

U.S. PATENT DOCUMENTS 5,061,845 A * 10/1991 Pinnavaia .................. 235/492
7,407,393 B2 8/2008 Ni et al.
7,420,803 B2 9/2008 Hsueh et al.

* cited by examiner

*Primary Examiner*—Karl D. Frech
(74) *Attorney, Agent, or Firm*—Maryam Imam; IPxLaw Group LLP

(57) ABSTRACT

In an embodiment of the present invention, a memory card includes a bottom plastic piece having a plurality of lateral sides, one of which includes a notch, and a cavity interposed along the lateral sides. A printed circuit board (PCB) assembly, including memory, is positioned in the cavity. A fin-structure is created as part of the manufacturing process of the bottom plastic piece of the card. The memory card is configured to function in a read-write mode when the fin-structure is present, and in a write-protect mode when the fins are snapped off, and the notch is exposed. Alternatively, a plug device can be insertably positioned into the notch, causing the memory card to function in a read-write mode when the plug device is positioned into the notch, and in a write-protect mode when the plug device is removed and the notch is exposed.

39 Claims, 11 Drawing Sheets

FIXED WRITE-PROTECT SEAMLESS MEMORY CARD

CROSS REFERENCE TO RELATED APPLICATIONS

Figure 1:
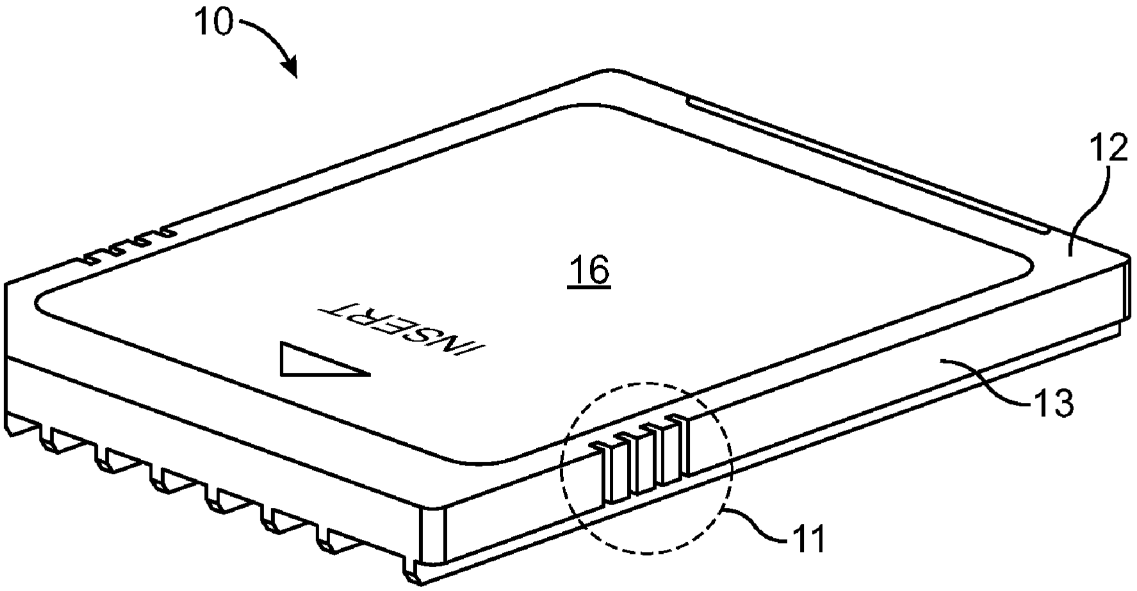

This application is a continuation-in-part of U.S. patent application Ser. No. 10/888,282 filed on Jul. 8, 2004, and entitled "MANUFACTURING METHOD FOR MEMORY CARD" and a continuation-in-part of U.S. patent application Ser. No. 10/913,868 filed on Aug. 6, 2004, and entitled "REMOVABLE FLASH INTEGRATED MEMORY MODULE CARD AND METHOD OF MANUFACTURE" and a continuation-in-part of U.S. patent application Ser. No. 11/744,119, filed on May 3, 2007, and entitled "SEAMLESS SECURED DIGITAL CARD MANUFACTURING METHODS WITH MALE GUIDE AND FEMALE SWITCH", the disclosures of which are incorporated herein by reference as though set forth in full.

BACKGROUND OF THE INVENTION

1. Field of the Invention

The present invention relates generally to the field of chip on board (COB) and surface mount technology (SMT) memory cards, and particularly to a method and apparatus for manufacturing memory cards with a robust write-protect device to protect the host device against possible damage.

2. Description of the Prior Art

As computers have gained enormous popularity in recent decades, so has the need for better and more efficient ways of storing memory. Notable among memory devices are the portable ones such as memory cards that may be carried around by the user to access their information at different locations. For other electronic devices such as iPods, Personal Digital Assistants (PDA), Digital cameras/camcorders, and cellular phones, memory cards are also used for storing of information. This is particularly common in the case of personal computers (PC) where the need often arises to transfer data from one PC to another. Examples of portable memory devices include nonvolatile memory devices such as secure digital cards (SD) that are removably connectible to a computer.

Conventional prior art memory cards provide both write-protect and read-write functionalities by sliding a male switch in a female slot or by sliding a female switch on a male guide. However, in the conventional designs of the memory cards, the switch may fall into the host device to which the memory card is coupled, and cause damage or jam the memory card slot. It is important that the write-protect device, in order to protect the host device from being damaged, be more robust than current switches, as exhibited by the various embodiments of the present invention. In addition, most users in practice use the memory card in the read-write mode, and rarely switch over to the write-protect mode.

Thus, it is desirable to manufacture a write-protectable memory card that is robust enough to withstand extensive use without damaging the host device or jamming the memory card slot thereof. In addition, the memory card should have a low cost of manufacturing, with an improved esthetic quality to appeal to a wide range of potential users.

SUMMARY OF THE INVENTION

Briefly, an embodiment of the present invention includes a memory card having a bottom plastic piece with a plurality of lateral sides, one of which includes a notch, and a cavity interposed along the lateral sides. A printed circuit board (PCB) assembly, including memory, is positioned in the cavity. Fins, made during the manufacturing process, are located in the read-write/write-protect notch-region of the memory card and cause the memory card to function in read-write mode when the fins are present, and in write-protect mode when the fins are removed and the notch is exposed. Alternatively, a removable cap is inserted into the notch, configuring the card to function in a read-write mode when the cap is present in the notch, and in a write-protect mode when the notch is exposed.

The foregoing and other objects, features, and advantages of the present invention will be apparent from the following detailed description of the preferred embodiments, which make reference to several figures of the drawings.

IN THE DRAWINGS

FIG. 1 shows a memory card 10, with fin-structure 11 located on lateral side 13, of bottom plastic piece 12, and label 16, in accordance with an embodiment of the present invention.

Figure 2:
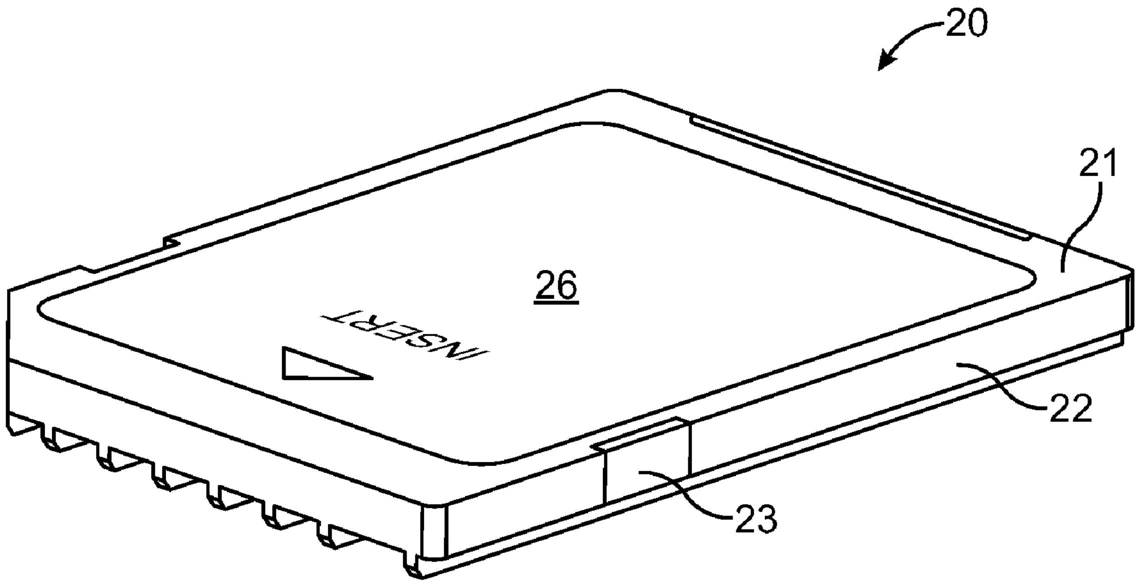

FIG. 2 shows a memory card 20, with a removable plug device 23 inserted on lateral side 22, in accordance with an alternative embodiment of the present invention.

Figure 3:
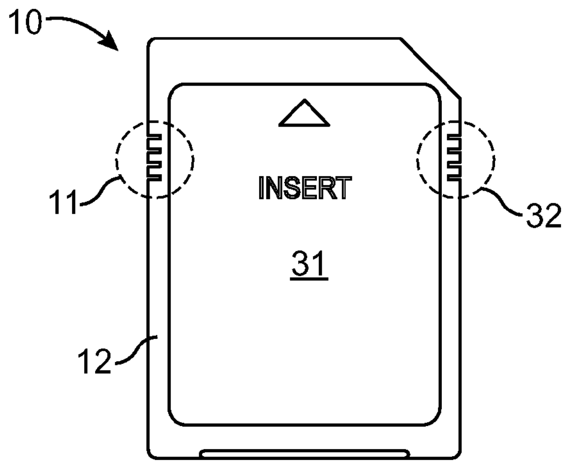

FIG. 3 shows a top view of memory card 10 with fin-structure 11, including label 31, in accordance with an embodiment of the present invention.

Figure 4:
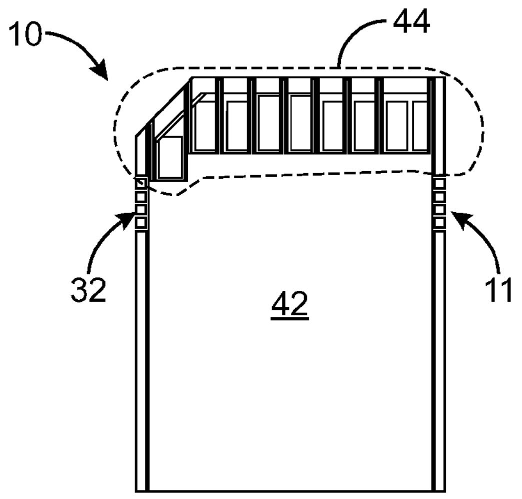

FIG. 4 shows a bottom view of memory card 10 with fin-structure 11, including the bottom surface 42 of the bottom plastic piece 12, and multi-pin connector 44, in accordance with an embodiment of the present invention.

Figure 5A:
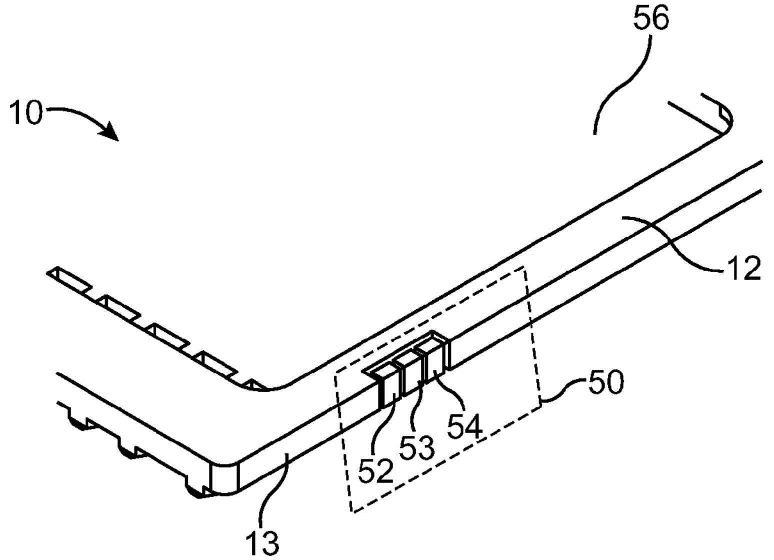
Figure 5B:
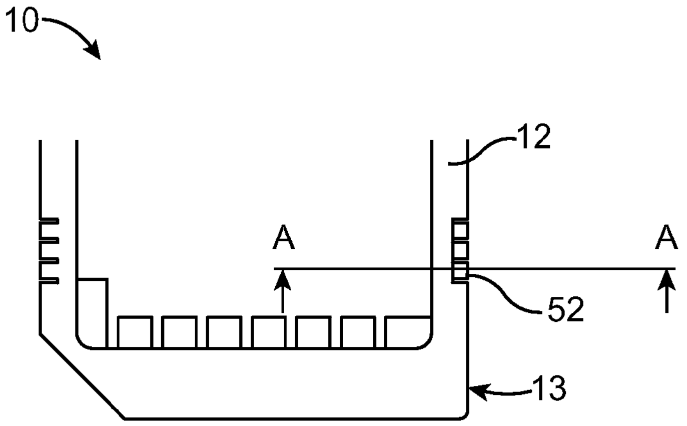
Figure 5C:
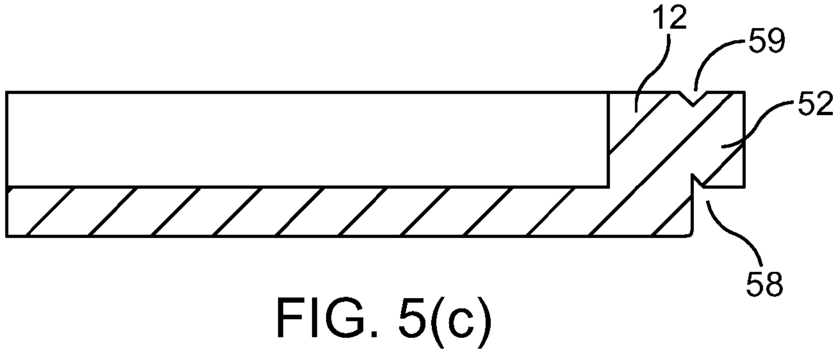
Figure 6A:
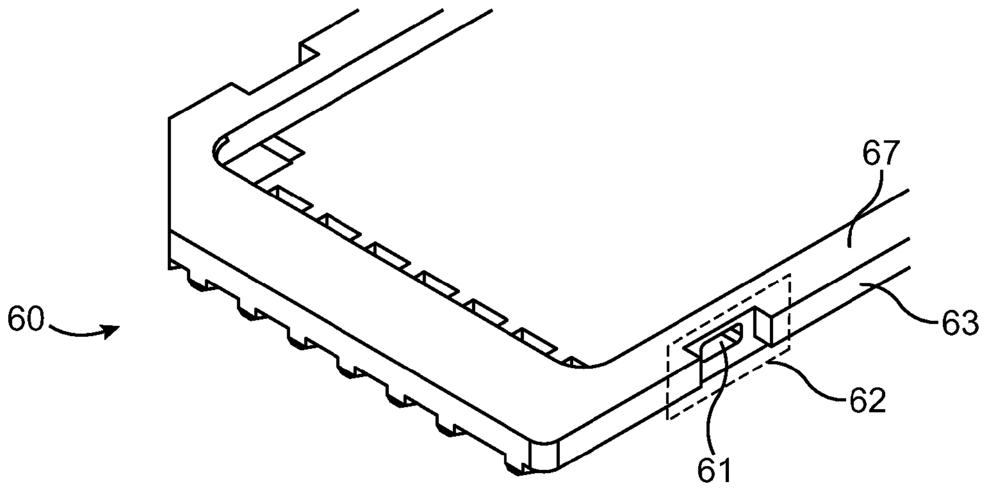
Figure 6B:
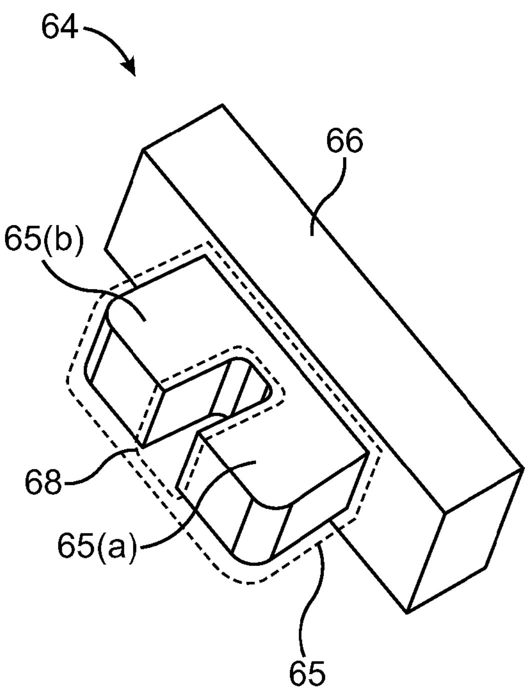
Figure 6C:
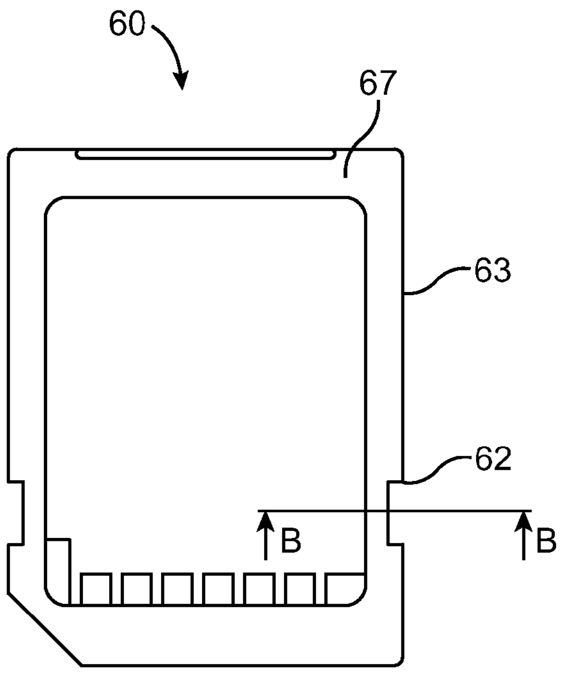
Figure 6D:
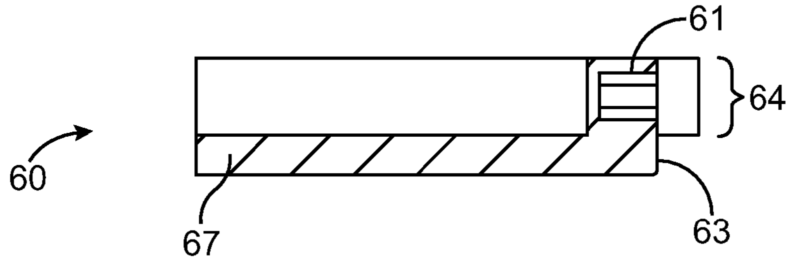

FIG. 5(*a*) shows an enlarged view of memory card 10, identifying each of the fins—52, 53, and 54—located in notch-region 50 of lateral side 13 in accordance with an embodiment of the present invention.

FIG. 5(*b*) shows a bottom view of the lower portion of memory card 10, with dashed lines designating the cross-sectional plane A-A through fin 52 and bottom plastic piece 12, illustrating the vantage point of FIG. 5(*c*).

FIG. 5(*c*) shows cross-sectional view A-A of bottom plastic piece 12, partially separated from fin 52 by v-grooves 58 and 59, of memory card 10.

FIG. 6(*a*) shows an enlarged view of Memory card 60, with an alternative write-protect device to the fins of card 10, identifying female socket 61 in notch-region 62, of lateral side 63 of bottom plastic piece 67, in accordance with an embodiment of the present invention.

FIG. 6(*b*) shows male read-write enabling plug 64, composed exposed of read-write plug portion 66, and a male plug connection element 65, further divided into two arms—65(*a*) and 65(*b*)—by slot 68.

FIG. 6(*c*) shows a bottom view of memory card 60 with dashed lines designating the cross-sectional plane B-B, through notch-region 62 of bottom plastic piece 67, illustrating the vantage point of FIG. 6(*d*).

FIG. 6(*d*) shows cross-sectional view B-B of bottom plastic piece 67 with plug 64 inserted into notch-region 62 and female socket 61, of memory card 60

Figure 7A:
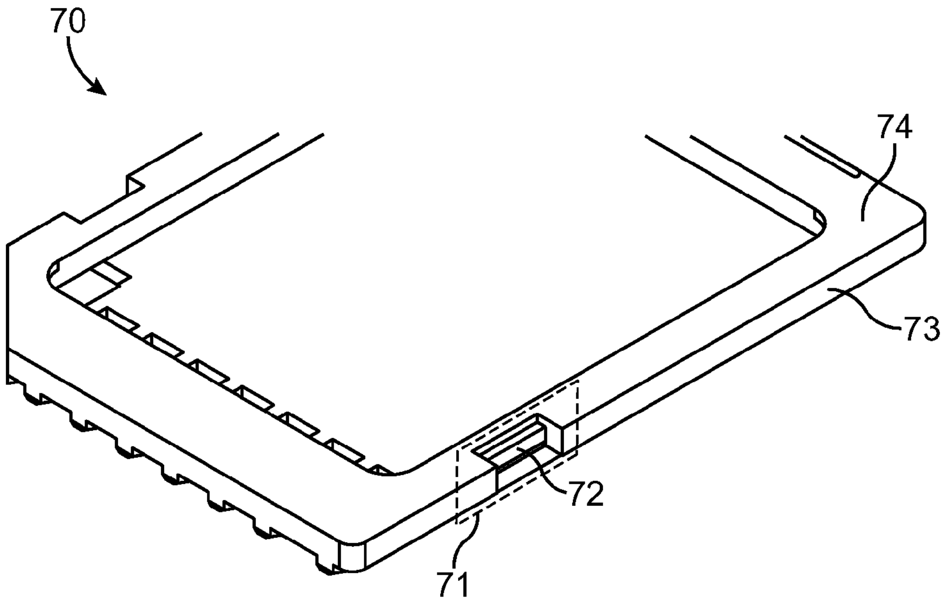
Figure 7B:
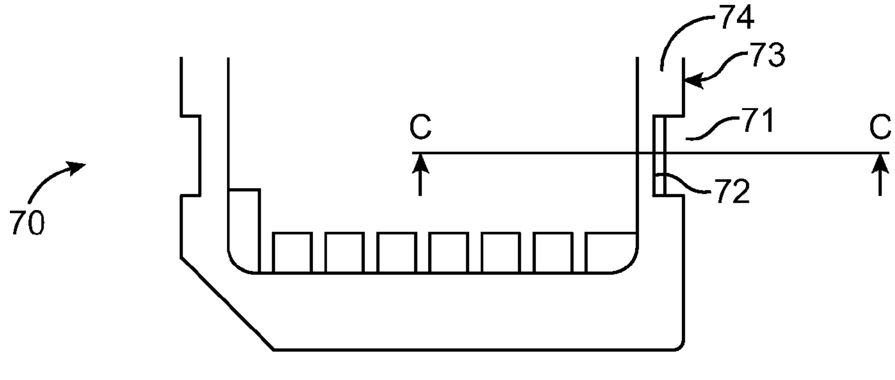
Figure 7C:
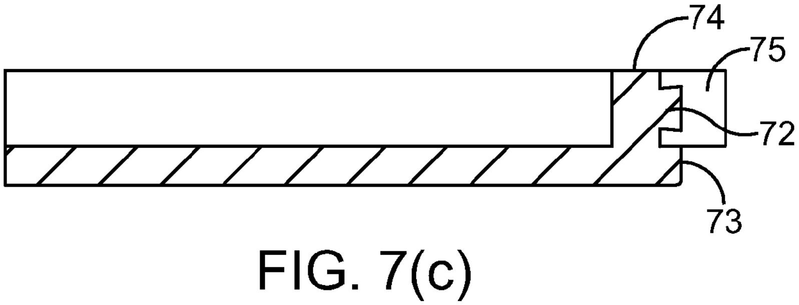

FIG. 7(*a*) shows an enlarged view of card 70, with an alternative write-protect device to fin-structure 11 of memory card 10 and female socket 61 of memory card 60, identifying clamp-bar 72 in notch-region 71, of lateral side 73 of bottom plastic piece 74, in accordance with an embodiment of the present invention.

FIG. 7(*b*) shows a partial bottom view of memory card 70 with dashed lines designating the cross-sectional plane C-C through notch-region 71, clamp-bar 72, and bottom plastic piece 74, illustrating the vantage point of FIG. 7(*c*).

FIG. 7(*c*) shows cross-sectional view C-C of bottom plastic piece 74, with clamp-device 75 attached to clamp-bar 72, of memory card 70.

Figure 8B:
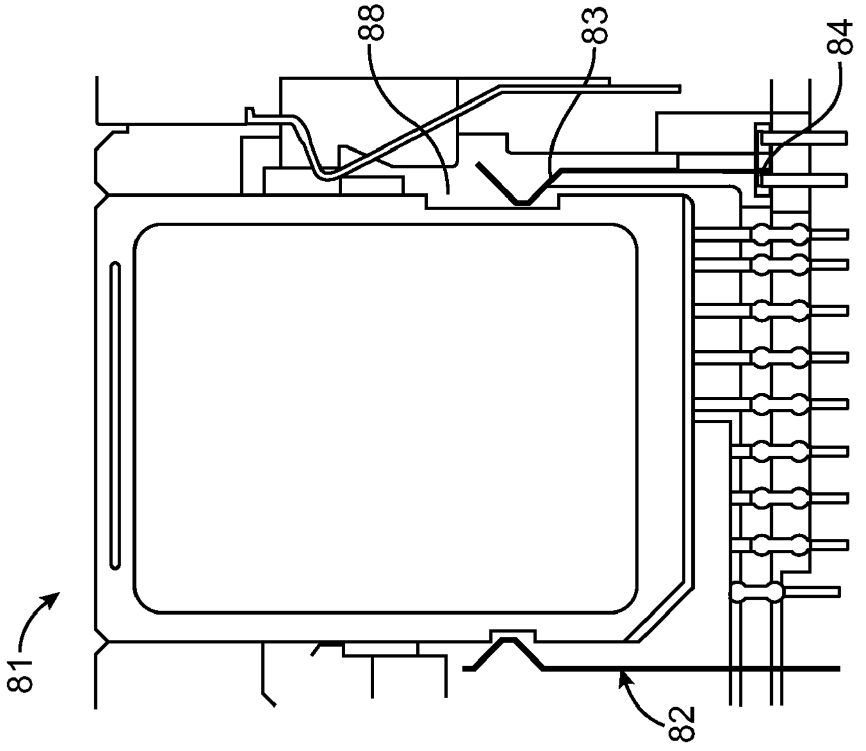
Figure 8A:
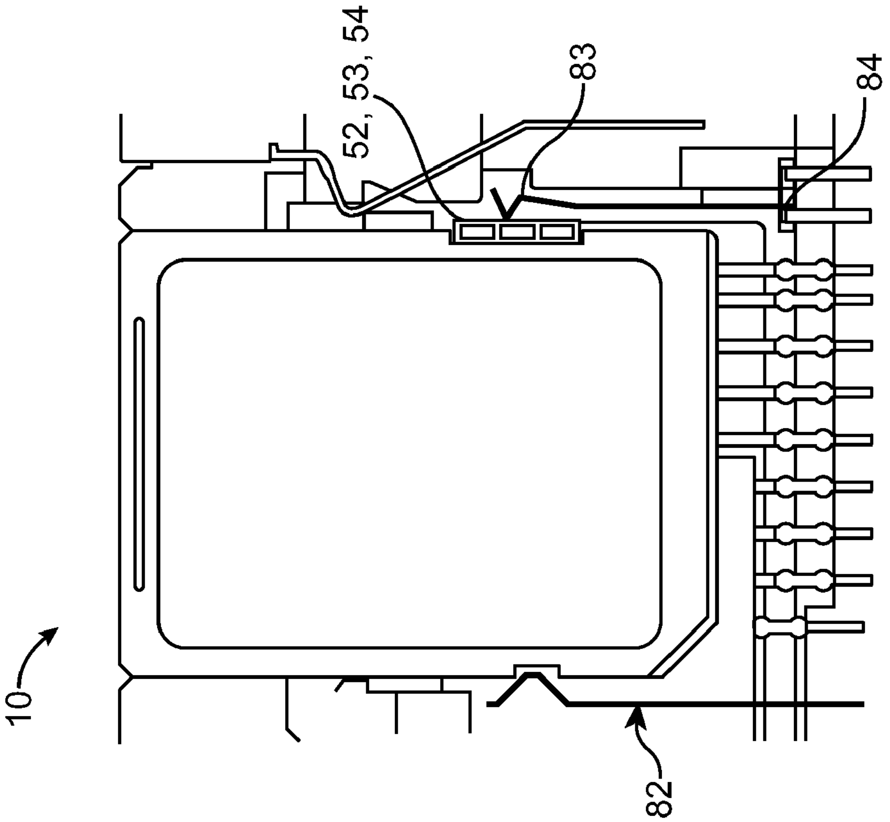

FIG. 8(*a*) shows memory card 10 mated to host device 84, being secured and held in position via spring bar 82, and read-write mode being enabled by the host device 84's detection spring 83 detecting the presence of fins 52, 53, and 54, in accordance with an embodiment of the present invention.

FIG. 8(*b*) shows memory card 81 mated to host device 84, being secured and held in position via spring bar 82, and write-protect mode being enabled by the host device 84's detection spring 83 detecting notch 88.

Figure 9:
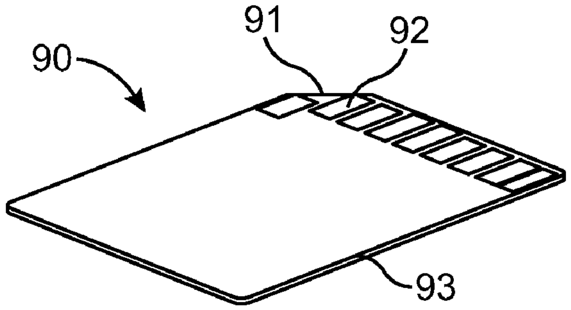

FIG. 9 shows a bottom view of PCB assembly 90 with decline corner 91, multi-pin interface connector 92, and substrate 93.

Figure 10A:
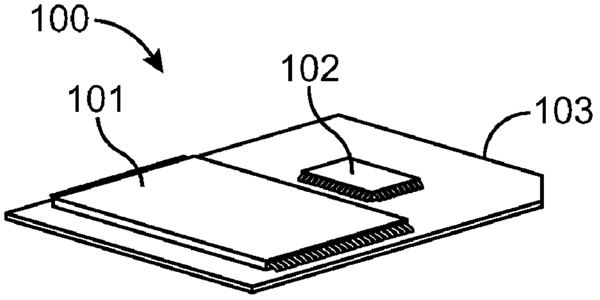
Figure 10B:
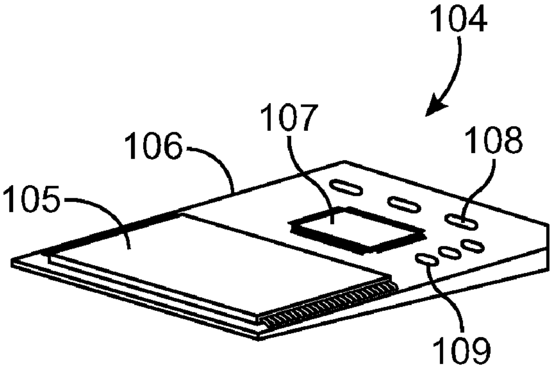

FIG. 10(*a*) shows Chip on Board (COB) PCB assembly 100 to include electronic devices 101 and 102, and substrate 103.

FIG. 10(*b*) shows a Surface Mounted Technology (SMT) PCB assembly 104 to include Electronic devices 105 and 107, passive components 108 and 109, and substrate 106.

Figure 11A:
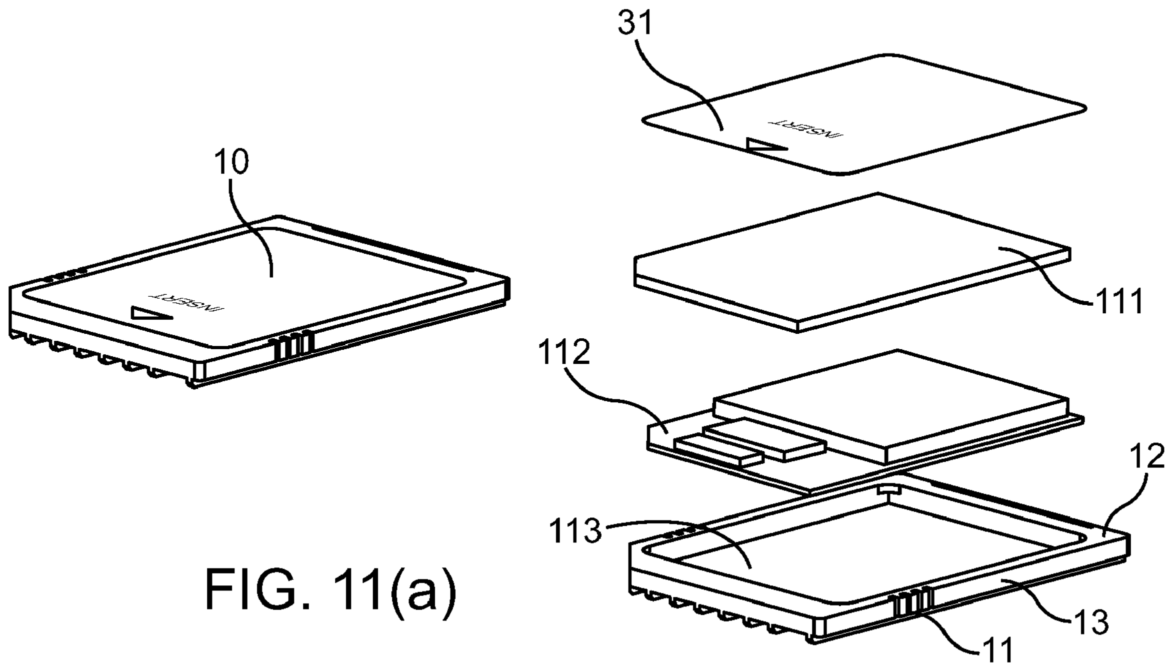
Figure 11B:
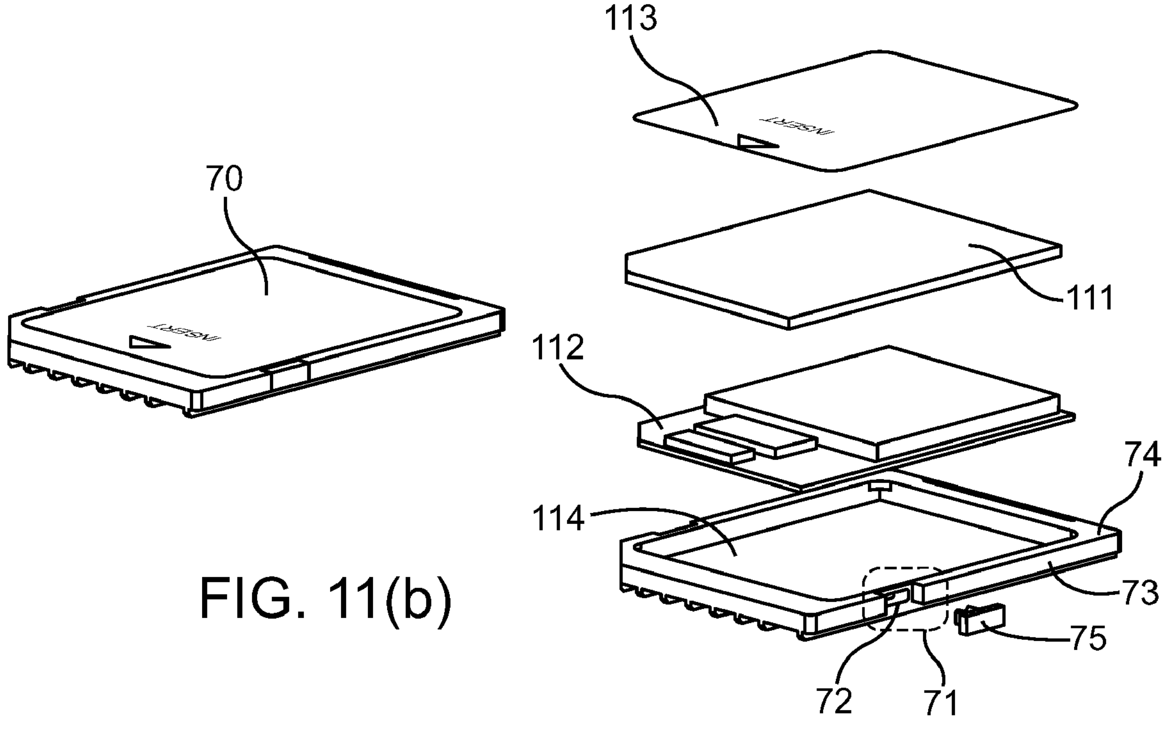

FIG. 11(*a*) shows finished memory card 10, with fin-structure 11 on lateral side 13, being comprised of bottom plastic piece 12, having shoe-shaped cavity 113 within which PCB assembly 112 is placed, molded top piece 111, and label 31, in accordance with an embodiment of the present invention.

FIG. 11(*b*) shows finished memory card 70, in accordance with an embodiment of the present invention. Memory card 70 is comprised of bottom plastic piece 74 with shoe-shaped cavity 114 within which PCB assembly 112 is placed, clamp-bar 72 within notch-region 71, which is fitted with clamp-device 75, injection-molded top piece 111, and label 113.

Figure 12A:
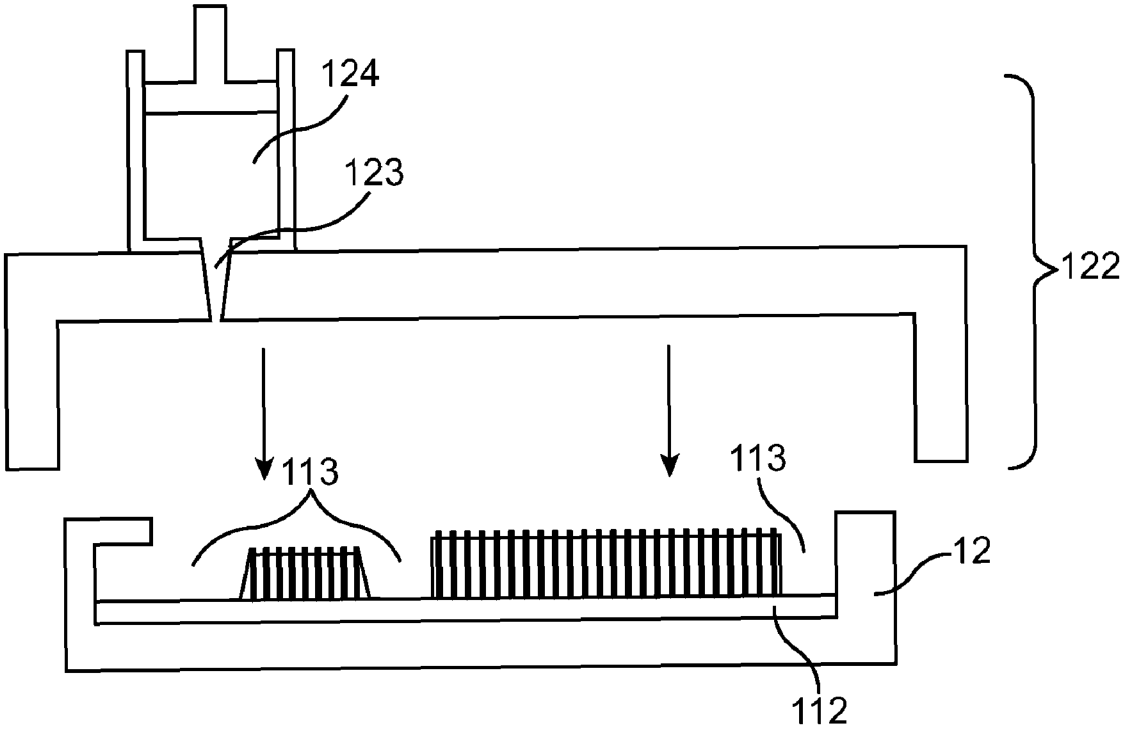
Figure 12B:
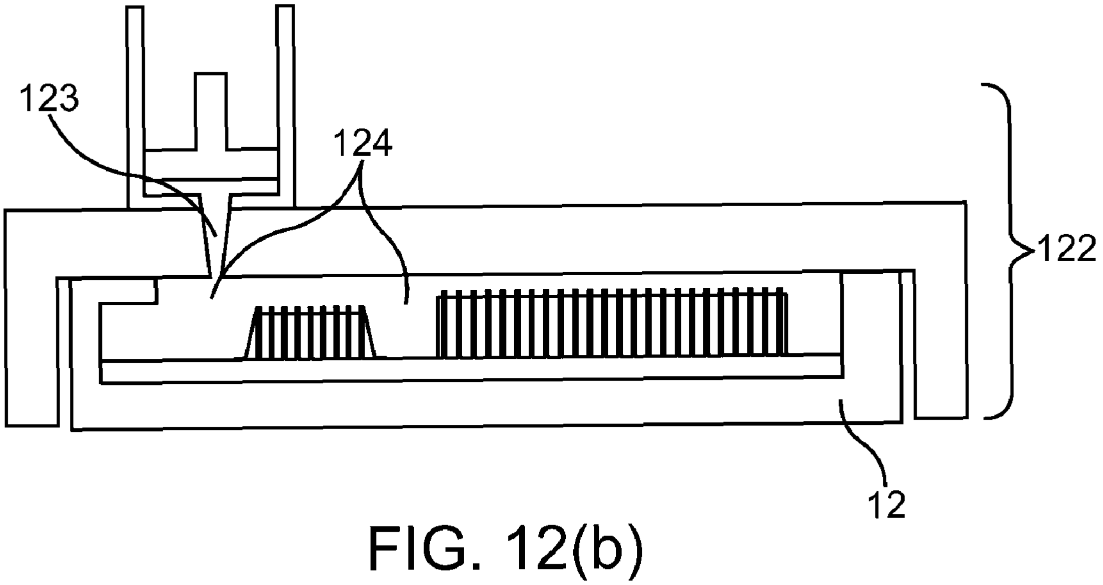
Figure 12C:
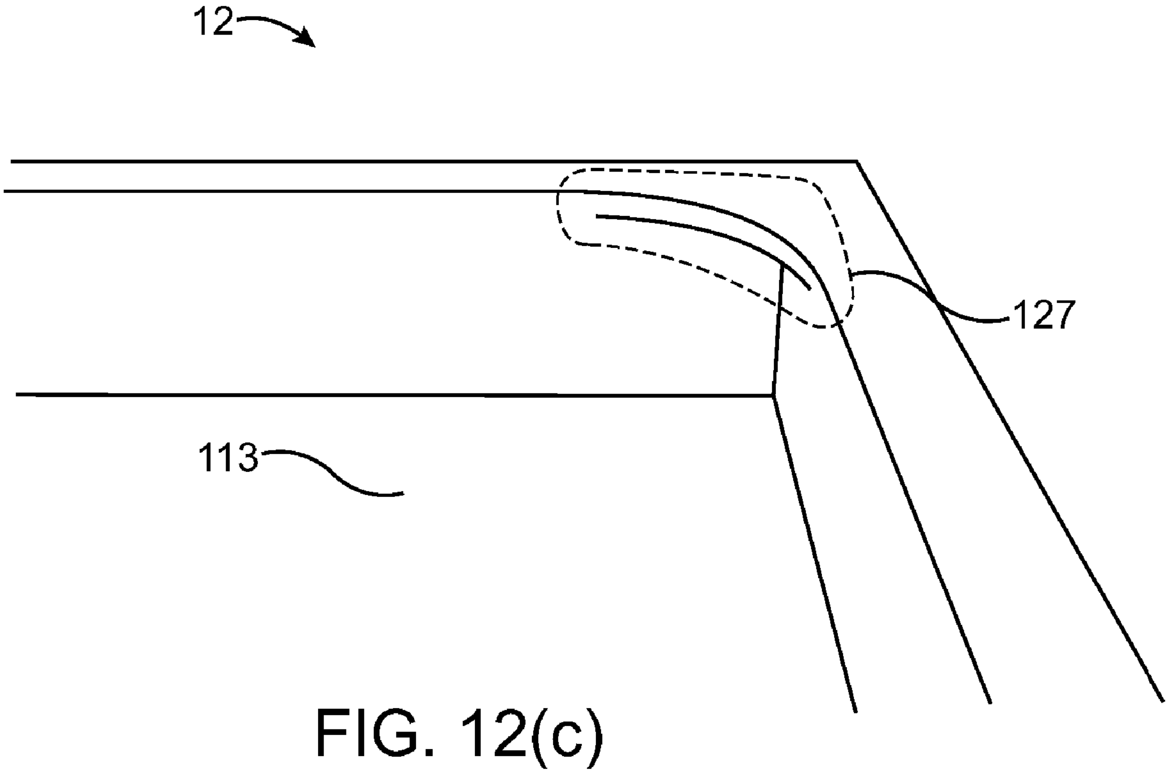

FIG. 12(*a*) shows injection-molding apparatus 122 with molten plastic 124, and injection port 123, descending upon bottom plastic piece 12 with PCB assembly 112 inserted into cavity 113.

FIG. 12(*b*) shows injection-molding apparatus 122 injecting molten plastic 124, through injection port 123, into cavity 113 of bottom plastic piece 12.

FIG. 12(*c*) shows a close-up view of corner-lip 127, on one of the four corners surrounding cavity 113, of bottom plastic piece 12.

Figure 13A:
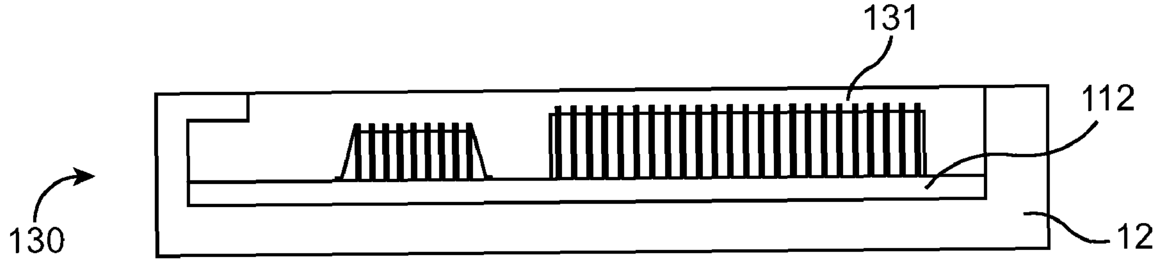
Figure 13B:
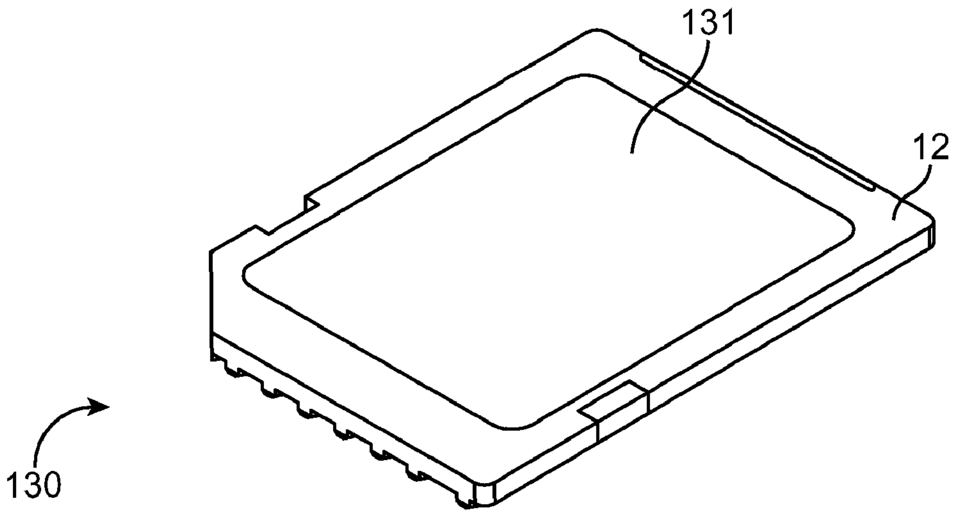

FIG. 13(*a*) shows a cross sectional view of completed memory card 130 to include bottom plastic piece 12, PCB assembly 112, and hardened plastic top piece 131, which previously was molten plastic 124, in accordance with an embodiment of the present invention.

FIG. 13(*b*) shows an angular top view of finished memory card 130, including bottom plastic piece 12 and top plastic piece 131.

DETAILED DESCRIPTION OF THE PREFERRED EMBODIMENTS

Referring now to FIG. 1, a memory card 10 with fin-structure 11 is shown to include a bottom plastic piece 12 and a label 16, in accordance with an embodiment of the present invention. The bottom plastic piece 12 has a plurality of lateral sides, one of which is lateral side 13, which is shown to have fin-structure 11. In one embodiment of the present invention, lateral side 13 includes three fins (as shown in FIG. 1), however other embodiments may include a greater or lesser number of fins.

Memory card 10 is manufactured with fin-structure 11 in place, causing the card to default in the read-write mode. When write protection is desired, fin-structure 11 is snapped off, by the user, exposing a notch on lateral side 13, as will be further discussed shortly. Thereafter, a write-protect sensor pin of the host device, as will be shown in other figures, is used to detect the write-protect mode of memory card 10, and no new information may be written onto the protected memory content of memory card 10 (i.e., thereafter, memory card 10 operates in the write-protect mode).

In practice, the memory card is often used in the read-write mode, i.e., information may be written to, or read from, the memory card by a host device. Then, when desired, a user repositions the traditional memory card's switch, enabling write-protect mode and preventing inadvertent data loss. The traditional switch, however, is overly sensitive to mechanical forces and can fall into the host device to which the card is connected, potentially causing physical damage to expensive electronic equipment. On memory card 10, fin-structure 11 replace the traditional write-protect switch, and there is no concern regarding their potential to fall into, and damage, a host device to which memory card 10 is connected. Additionally, once fin-structure 11 is removed, the write-protection is permanent, and the risk of inadvertent read-write mode reversion, and subsequent over-writing of valuable data is eliminated.

Printed on label 16 may be a custom designed logo and other information. The label 16 has an adhesive layer on the underside for attachment to the top surface of memory card 10. Label 16 covers the interface on the top surface of memory card 10 to render a seamless appearance thereto, and enhance aesthetic value. In addition, label 16 enhances moisture and water resistance of the memory card 10 to protect the electronic devices within.

Referring now to FIG. 2, Memory card 20, with a removable plug device 23, is shown as an alternative embodiment of the present invention. Memory card 20 is shown to include a label 26, and a plastic bottom piece 21 having a plurality of lateral sides, one of which is the lateral side 22. Lateral side 22 includes a removable write-protect/read-write plug device 23. Memory card 22 may be used in both the read-write, and write-protect modes.

Specifically, the write-protect/read-write plug device 23 is inserted into a notch, as shown in FIG. 2. While plug device 23 is inserted, the memory card 22 is in the read/write mode and information may be written to, or read from memory card 22. Plug device 23 may be removed by being pulled off, i.e. by a user of card 20, to enable write-protect mode and prevent the memory contents of card 20 from being over-written. Plug device 23 may be reinserted to resume the read-write mode of operation. Plug device 23 may either be a male, or female device, as described in more detail below.

Referring now to FIG. 3, a top view of the memory card 10 with fin-structure 11, is shown to include a label 31, in accordance with an embodiment of the present invention. Label 31 is positioned on the top of card 10 and gives a seamless appearance, enhancing the aesthetic value thereof.

Referring now to FIG. 4, a bottom view of memory card 10 with fin-structure 11, is shown to include the bottom surface 42 of the bottom plastic piece 12 of the embodiment of FIG. 1, and a multi-pin interface connector 44, in accordance with an embodiment of the present invention. The interface connector 44 couples the memory card 10 to a host device for transfer of information therebetween, and has a number of pins. In the embodiment of FIG. 4, interface connector 44 is shown to have nine pins. Fins 32, which are shown located on a lateral side opposite to lateral side 12, serve to balance the overall product symmetry, and do not serve any purpose in relation to the function of the card; optionally memory card 10 may be manufactured without fins 32.

Referring now to FIG. 5(*a*), an enlarged view of fin-structure 11 (shown in FIG. 1) on lateral side 13 is shown to be comprised of three fins—52, 53, 54—in accordance with an embodiment of the present invention. With fins 52-54 intact, as shown in FIG. 5(*a*), memory card 10 is in the default mode which is read-write mode. Fins 52-54 may easily be snapped off using, for example, fingers to activate the write-protect mode of memory card 10.

In one embodiment of the present invention, fins 52-54 are each composed of plastic, and are created as part of the injection-molding process that forms the bottom plastic piece 12—which will be further discussed later. While three fins, 52-54, are shown in FIG. 5(*a*), any number of such structures may be employed, although ease of use is better realized when using fewer.

Referring now to FIG. 5(*b*), a top view of the lower portion of memory card 10, cross-sectional plane A-A is designated as crossing through fin 52, and bottom plastic piece 12. FIG. 5(*c*) provides a cross-sectional view of the memory card, from plane A-A, showing that fins 52-54 are contiguous with bottom plastic piece 12, being created from the same step of the injection-molding process. V-grooves 58 and 59, disposed at the bottom and top of the fins respectively (1) demarcate fins 52-54 from the rest of memory card 10, and (2) facilitate easy removal of fins 52-54, from memory card 10, by the user.

Referring now to FIG. 6(*a*), memory card 60 is shown to include bottom plastic piece 67 with lateral side 63, which contains female socket 61 disposed in notch-region 62, in accordance with an alternative embodiment of the present invention. Female socket 61 and notch-region 62 generally house a male plug device, shown in following FIG. 6(*b*), which is removably connected to female socket 61. When the male plug device is present within notch-region 62, memory card 60 is in read-write mode and information may be read from or written to memory card 60's memory. When the male plug device is removed, memory card 60 is placed in write-protect mode, and information may only be read from the memory. Although female-socket 61 is disposed substantially in the center of notch-region 62, it may be disposed anywhere within the notch-region 62 that allows for user removal and reconnection.

FIG. 6(*b*) shows male plug device 64, manufactured as part of a single molding step, comprised of a male plug connection element 65 centrally disposed on a side of exposed read-write plug portion 66. Male plug connection element 65 is manufactured so that it has two arms—65(*a*) and 65(*b*)—separated by slot 68. Arms 65(*a*) and 65(*b*) are manufactured to slope outward from exposed read-write plug portion 66, and gradually spread wider, increasing in cross-sectional area as their distance from exposed read-write plug portion 66 becomes greater. Arms 65(*a*) and 65(*b*) of plug connection element 65 are narrowest where they connect to exposed read-write portion 66, and at their ends are ultimately wider than female socket 61 of memory card 60. This gradual widening of male plug connection element 65, together with slot 68 in the center of connection element 65, causes male plug connection element 65 to become slightly compressed and subsequently expand upon insertion into female socket 61. This ensures a snug fit, so that inadvertent loss or removal of male plug device 64 is unlikely. Exposed read-write plug portion 66 is accessible to the user even when male plug device 64 is inserted in notch-region 62, allowing the user easy removal with, for example, fingers, to enable write-protect mode.

Referring now to FIG. 6(*c*), a top view of memory card 60, cross-sectional plane B-B is designated as crossing through notch-region 62, and bottom plastic piece 67.

FIG. 6(*d*) shows cross-sectional view B-B, where male plug device 64 is tightly coupled to female socket 61, and protrudes from lateral side 63 of memory card 60 to facilitate easy removal of male plug device 64 by the user.

FIG. 7(*a*) shows memory card 70 in accordance with an alternative embodiment of the present invention. Memory card 70's notch-region 71, on lateral side 73, contains a clamp-bar 72 for attachment and removal of a clamp-device, enabling read-write or write-protect mode respectively.

FIG. 7(*b*), a top view of memory card 70, designates cross-sectional plane C-C as crossing through notch-region 71, clamp-bar 72, and bottom plastic piece 74.

FIG. 7(*c*) shows cross-sectional view C-C, where clamp-device 75 is tightly coupled to clamp-bar 72, and protrudes beyond lateral side 73, to facilitate easy removal of clamp-device 75 by the user when write-protect mode is desired. Additionally, the non-permanent nature of the clamp-bar/clamp-device read-write/write-protect mechanism, allows memory card 70 to be temporarily protected from re-writing by removal by clamp-device 75, and for re-writing to be enabled, when desired, by re-attachment of clamp-device 75.

In the embodiment of the present invention where a clamp-device 75 is employed to control read-write/write-protect status of memory card 70 as previously noted, clamp-device 75 is snapped into place on clamp-bar 72 in a manner having clamp-device 75 positioned to fit around clamp-bar 72 tightly, so that clamp-device 75 will not be removed without user effort, and will not inadvertently fall into the host with which memory card 70 is coupled.

Referring now to FIG. 8(*a*), memory card 10 is shown coupled to a portion of host device 84, and is capable of having information written to, or read from, its memory using the various embodiments of the present invention. Spring bar 82, a mechanical mechanism of host 84, may be used, but is not required, to assist holding memory card 10 in place. Other embodiments of the present invention may not include a complementary feature on memory card 10 to interface with spring bar 82. Memory card 10 retains fins 52, 53, and 54, the presence of which are detected by the host 84's read-write/write-protect detection device 83, and read-write mode is enabled.

In FIG. 8(*b*), fins 52-54 have been removed, exposing notch 88, which is detected by read-write/write-protect detection device 83 and write-protect mode is thereby enabled. The complete removal of fins 52-54, male read-write enabling plug 64, or clamp-bar 72, ensures that dynamically located and user manipulated switches, like those of a traditional memory card, will not fall off and cause permanent damage to the host device 84, or become inadvertently returned to the read-write position.

FIG. 9 shows a bottom view of internal PCB assembly 90 of a memory card, of any of the embodiments of the present invention. PCB assembly 90 is shown to include decline corner 91 for proper positioning within the bottom plastic piece, and a multi-pin connector 92, on substrate 93, for communicating with the host device. Multi-pin connector 92 couples the host device to the memory card through the use of a wide range of protocols, examples of which are presented in U.S. Patent Publication No. US2005/0197017 A1, publication date Sep. 8, 2005 entitled, "EXTENDED SECURE_DIGITAL (SD) DEVICES AND HOSTS," disclosure of which is herein incorporated by reference as though set in full. Examples of protocols used to couple the SD card with a host device through interface connector 92 include, but are not limited to, Multi-Media Card (MMC), Serial Peripheral Interface (SPI), Secure Digital (SD), Enhanced Multi-Media Card (EMMC), Universal Serial Bus (USB), Enhanced Universal Serial Bus (EUSB), Peripheral Component Interconnect Express (PCIE), Serial Advanced Technology Attachment (SATA) and the IEEE 1394 interface (also referred to as "firewire"). In other embodiments of the present invention: multi-pin connector 92 may have any number of pins; and decline corner 91 may not be present, or may be present in multiplicity on any number or combination of the corners on substrate 93.

FIG. 10(*a*) shows a top angular view of internal PCB assembly 100, employing chip on board (COB) electronics. PCB assembly 100 is composed of electronic devices, for example 101 and 102, mounted to substrate 103. Examples of electronic devices include flash memory units, controllers, and passive components.

FIG. 10(*b*) shows a top angular view of an alternative PCB assembly 104, employing surface mounted technology (SMT) electronics. Assembly 104 is composed of, for example, electronic devices 105 and 107, and passive component 108-109, mounted on substrate 106. Passive components 108-109 may include, for example, resistors, capacitors, and inductors. In other embodiments of the present invention, electronic devices 105 and 107, and passive components 108 and 109 can be mounted on both sides, or on the bottom-side of substrate 106.

FIG. 11(*a*) shows an overview of the assembly process of memory card 10. Bottom plastic piece 12, including fin-structure 11 on lateral side 13, is created from a single injection-molding step. Bottom plastic piece 12 has an upper-lid on one side, which can be better seen in FIGS. 12(*a*) and 12(*b*), giving cavity 113 a shoe-shaped appearance; and is built to conform to the standard memory card dimensions and specifications. Subsequently, PCB assembly 112 is placed within shoe-shaped cavity 113 of bottom plastic piece 12, so that PCB assembly 112 is housed within bottom plastic piece 12. Top plastic piece 111 is then created by a second injection-molding step, which is shown in more detail in FIGS. 12(*a*) and (*b*). Finally, label 31's bottom adhesive layer is used to affix label 31 on top of top plastic piece 111 and bottom plastic piece 12; improving both memory card 10's aesthetic appeal, and, by acting as a seal, to increase the memory card 10's ability to resist damage that might be caused by moisture, dust, or dirt. In other embodiments of the present invention, cavity 113 may have other shapes such as rectangular parallel-piped, or cubic. Memory card 10, with fin-structure 11, functions by default in read-write mode. Fin-structure 11 may be snapped off to form a permanent notch on lateral side 13, enabling write-protect mode.

FIG. 11(*b*) shows the assembly of memory card 70, with clamp-bar 72 in notch-region 71 of lateral side 73, as an alternative to the fin-structure 11 read-write/write-protect mechanism. Memory card 70 is manufactured in a similar 2-step molding process as that described for memory card 10. Bottom plastic piece 74, PCB assembly 112, and label 113 are coordinate to parts 13, 112, and 31 of FIG. 11(*a*) respectively. Upon completion of the 2-step molding process, clamp-device 75 is clamped on to clamp-bar 72 of bottom plastic piece 74, allowing molded memory card 70 to function in read-write mode. Label 113 is then attached to the top surface of top plastic piece 111, having printed matter thereon, such as a company logo and other information. Additionally, label 113 covers the interface between the top plastic piece 111 and bottom plastic piece 74, adding a seamless outlook to the molded memory card 70 that is more aesthetically appealing. The user can remove clamp-device 75 when it is desired for memory card 70 to operate in write-protected mode.

FIGS. 12(*a*) and 12(*b*) further explore the second step injection-molding process of top plastic piece 111, the product of which is abstractly shown in FIGS. 11(*a*) and 11(*b*). Injection-molding apparatus 122 descends upon bottom plastic piece 12 after PCB assembly 112 (either SMT or COB) has been placed within bottom plastic piece 12's shoe-shaped cavity 113. After the injection-molding apparatus 122 is pressed snugly against bottom plastic piece 12, to ensure that there is no leakage, pressure is applied to molten plastic 124, forcing it through injection port 123 and into cavity 113. Molten plastic 124 fills cavity 113 of the bottom plastic piece 12, securing and sealing the electronics within; and hardening to provide a clean appearance and rugged outer shell.

FIG. 12(*c*) shows corner lip 127 of bottom plastic piece 12. Bottom plastic piece 12 contains four of these lips—one overhanging each of the corners surrounding cavity 113. Lip 127 serves as a support and a lid for molten plastic 124, increasing the surface area of the plastic with which molten plastic 124 can bind, and ensuring that once molten plastic 124 hardens, it is not able to fall out—even under stressful conditions.

Referring now to FIG. 13(*a*), a cross section of finished memory card 130 is shown. Bottom plastic piece 12 is formed by the first step of the injection-molding process, creating shoe shaped cavity 113 where PCB assembly 112 is placed. After PCB assembly 112 has seated, the second step of the injection molding process fills the remaining cavity with molten plastic, which hardens to become top plastic piece 131, sealing the PCB inside.

Because the manufacturing process described above is a 2-step molding process, the glass transition temperature of the plastic material of the second molding step—molten plastic 124, which becomes hardened plastic 131—should be higher than the glass transition temperature of the material of the first molding step that creates bottom plastic piece 12. This ensures strong cross-linking between the top plastic piece 131 and the bottom plastic piece 12.

FIG. 13(*b*) shows a top angular view of finished memory card 130. The two-step injection-molding process provides for a finished product with clean lines, and protected internal electronic components.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A memory card comprising:

a bottom plastic piece having a plurality of lateral sides, said bottom plastic piece further having a cavity interposed along said plurality of lateral sides; and a printed circuit board (PCB) assembly, including memory, and positioned in said cavity;

a notch formed on one of said plurality of lateral sides of said bottom plastic piece, the notch having a length that is smaller than the length of each of the plurality of lateral sides; and a read-write plug insertably positioned into said notch where the memory card is configured to function in a read-write mode when the read-write plug is positioned into the notch and in a write-protect mode when the notch is exposed.

2. A memory card, as recited in claim 1, wherein the memory card is a secure digital (SD) card.

3. A memory card, as recited in claim 1, wherein the read-write plug is a female read-write plug.

4. A memory card, as recited in claim 3, wherein the read-write plug is a male read-write plug.

5. A memory card, as recited in claim 4, further including a label disposed on top of the bottom plastic piece to protect the PCB and to provide a seamless appearance thereto.

6. A memory card, as recited in claim 5, wherein the memory card is coupled to a host device to transfer information between said memory card and said host device.

7. A memory card, as recited in claim 6, to further include an interface adapted to couple the memory card to the host device.

8. A memory card, as recited in claim 1, wherein the notch includes a clamp-bar into which the read-write plug is snapped into place.

9. A memory card, as recited in claim 1, wherein the cavity is rectangular in shape.

10. A memory card comprising:

a bottom plastic piece having a plurality of lateral sides, said bottom plastic piece further having a cavity interposed along said plurality of lateral sides;

a printed circuit board (PCB) assembly, including memory, and positioned in said cavity; and a removable fin-structure formed on one of the plurality of lateral sides, where the fin-structure causes the card to function in read-write mode when intact, and to function in write-protect mode when removed.

11. A memory card, as recited in claim 10, further including a notch formed in substantially the same location as the fin-structure within the bottom plastic piece, which is exposed upon removal of the fin-structure.

12. A memory card, as recited in claim 11, further including a label disposed on top of the bottom plastic piece to protect the PCB and to provide a seamless appearance thereto.

13. A memory card, as recited in claim 12, wherein the memory card is coupled to a host device to transfer information between said memory card and said host device.

14. A memory card, as recited in claim 13, further include an interface adapted to couple the memory card to the host device.

15. A memory card, as recited in claim 10, wherein the cavity is rectangular in shape.

16. A memory card comprising:

means having interposed therein a cavity, and having a plurality of lateral sides for housing a printed circuit board (PCB) assembly;

means for storing information, positioned within said cavity;

notch means formed, in its entirety, in one of the plurality of lateral sides for indicating to a host device that the memory card is in write-protect mode, said notch having a length that is smaller than the length of each of the plurality of lateral sides; and plug means that is removably positioned into said notch for causing the memory card to be read-write mode.

17. A memory card, as recited in claim 16, wherein the memory card is a secure digital (SD) card.

18. A memory card, as recited in claim 16, wherein the read-write plug is a female read-write plug.

19. A memory card, as recited in claim 18, wherein the read-write plug is a male read-write plug.

20. A memory card, as recited in claim 19, further including a label disposed on top of the bottom plastic piece to protect the PCB and to provide a seamless appearance thereto.

21. A memory card, as recited in claim 20, wherein the memory card is coupled to a host device to transfer information between said memory card and said host device.

22. A memory card, as recited in claim 21, to further include an interface adapted to couple the memory card to the host device.

23. A memory card, as recited in claim 16, wherein the notch includes a clamp-bar into which the read-write plug is snapped into place.

24. A memory card, as recited in claim 16, wherein the cavity is rectangular in shape.

25. A memory card comprising:

means having interposed therein a cavity, and having a plurality of lateral sides for housing a printed circuit board (PCB) assembly;

means for storing information, positioned within said cavity;

means formed on one of the plurality of lateral sides and having a length that is smaller than the length of each of the plurality of lateral sides for causing the memory card to operate in read-write mode, and upon removal of the formed means, for causing the memory card to operate in a write-protected mode.

26. A memory card, as recited in claim 25, wherein the memory card is a secure digital card.

27. A memory card, as recited in claim 25, where the formed means is a fin-structure.

28. A memory card, as recited in claim 27, further including a notch formed in substantially the same location as the fin-structure within the bottom plastic piece, which is exposed upon removal of the fin-structure.

29. A memory card, as recited in claim 28, further including a label disposed on top of the bottom plastic piece to protect the PCB and to provide a seamless appearance thereto.

30. A memory card, as recited in claim 29, wherein the memory card is coupled to a host device to transfer information between said memory card and said host device.

31. A memory card, as recited in claim 30, to further include an interface adapted to couple the memory card to the host device.

32. A memory card, as recited in claim 25, wherein the cavity is rectangular in shape.

33. A method of manufacturing a memory card comprising:

forming a bottom plastic piece having a plurality of lateral sides to form a cavity interposed among said lateral sides, and one of said lateral sides having a notch with an exposed clamp-bar therein;

positioning a printed circuit board (PCB) assembly, including memory, in said cavity;

filling the cavity of the bottom plastic piece with molten plastic so that a top plastic piece is formed; and placing a clamp-device onto clamp-bar within said notch.

34. A method of manufacturing, as recited in claim 33, wherein the memory card is a secure digital (SD) card.

35. A method of manufacturing, as recited in claim 33, wherein during the step of forming the top plastic piece, injecting the molten plastic into the cavity.

36. A method of manufacturing a memory card comprising:

forming a bottom plastic piece having a plurality of lateral sides so as to create a cavity interposed among said lateral sides, and one of said lateral sides having a fin-structure which causes the card to function in read-write mode;

positioning a printed circuit board (PCB) assembly, including memory, in said cavity; and filling the cavity of the bottom plastic piece with molten plastic so that a top plastic piece is formed.

37. A method of manufacturing, as recited in claim 36, wherein the memory card is a secure digital (SD) card.

38. A method of manufacturing, as recited in claim 36, wherein during the step of forming the top plastic piece, injecting the molten plastic into the cavity.

39. A method of manufacturing a memory card, as recited in claim 36, further including the step of removing the fin-structure to create a notch, and causing the card to function in write-protect mode.

* * * * *